(12) United States Patent
Nakada et al.

(10) Patent No.: US 10,184,185 B2
(45) Date of Patent: Jan. 22, 2019

(54) GAS FLOW MONITORING METHOD AND GAS FLOW MONITORING APPARATUS

(71) Applicants: CKD CORPORATION, Komaki-shi, Aichi (JP); HORIBA STEC, CO., LTD., Kyoto-shi, Kyoto (JP)

(72) Inventors: Akiko Nakada, Kasugai (JP); Yasunori Nishimura, Kasugai (JP); Minoru Ito, Kasugai (JP); Masami Nishikawa, Otsu (JP); Shigeyuki Hayashi, Kyoto (JP); Atsushi Ieki, Kyoto (JP)

(73) Assignees: CKD CORPORATION, Komaki (JP); HORIBA STEC. CO., LTD., Kyoto (JP)

( * ) Notice: Subject to any disclaimer, the term of this patent is extended or adjusted under 35 U.S.C. 154(b) by 121 days.

(21) Appl. No.: 15/363,854

(22) Filed: Nov. 29, 2016

(65) Prior Publication Data

US 2017/0167026 A1    Jun. 15, 2017

(30) Foreign Application Priority Data

Dec. 15, 2015    (JP) ................................. 2015-243794

(51) Int. Cl.
| *C23C 16/52* | (2006.01) |
| *C23C 16/455* | (2006.01) |
| *G01F 1/34* | (2006.01) |
| *G01F 3/36* | (2006.01) |
| *G01F 3/38* | (2006.01) |

(52) U.S. Cl.
CPC ........ *C23C 16/52* (2013.01); *C23C 16/45561* (2013.01); *G01F 1/34* (2013.01); *G01F 3/36* (2013.01); *G01F 3/38* (2013.01)

(58) Field of Classification Search
CPC ..... C23C 16/52; C23C 16/45561; G01F 1/34; G01F 3/36; G01F 3/38
See application file for complete search history.

(56) References Cited

U.S. PATENT DOCUMENTS

| 5,542,286 A * | 8/1996 | Wang ..................... G01N 30/32 |
| | | 73/1.34 |
| 7,918,238 B2 * | 4/2011 | Tanaka .................. G01F 1/6847 |
| | | 137/10 |
| 8,271,211 B2 * | 9/2012 | Chung ..................... G01F 1/34 |
| | | 137/2 |

(Continued)

FOREIGN PATENT DOCUMENTS

JP    2013084857 A    5/2013

*Primary Examiner* — Eric Keasel
(74) *Attorney, Agent, or Firm* — Oliff PLC

(57) ABSTRACT

In a gas flow monitoring method using a MFC (a flow control device) for controlling a flow rate of process gas from a process gas supply source and supply the process gas to a predetermined process chamber, a start shut-off valve placed upstream of the MFC, and a pressure gauge placed between the start shut-off valve and the MFC, the start shut-off valve is closed and a drop of pressure on an upstream side of the MFC is measured by the pressure gauge to measure a flow rate of the MFC, thereafter, the start shut-off valve is opened to monitor the flow rate of the MFC. The MFC is switched from an ON state to an OFF state before the start shut-off valve is opened. The method enables in-line monitoring a low rate of process gas without affecting a semiconductor manufacturing process.

5 Claims, 11 Drawing Sheets

(56) References Cited

U.S. PATENT DOCUMENTS

| | | | |
|---|---|---|---|
| 8,826,935 B2* | 9/2014 | Nakada | G01F 1/00 137/486 |
| 2007/0233412 A1* | 10/2007 | Gotoh | G01F 1/6847 702/100 |
| 2013/0092269 A1 | 4/2013 | Nakada et al. | |

* cited by examiner

↑ : IN VALVE-OPEN
↓ : IN VALVE-CLOSE

GAS FLOW MONITORING METHOD AND GAS FLOW MONITORING APPARATUS

CROSS-REFERENCE TO RELATED APPLICATIONS

This application is based upon and claims the benefit of priority from the prior Japanese Patent Application No. 2015-243794 filed on Dec. 15, 2015, the entire contents of which are incorporated herein by reference.

BACKGROUND

Technical Field

The present invention relates to a gas flow monitoring method and a gas flow monitoring apparatus for monitoring a flow rate of a flow control device (a mass flow controller and others) to be used in a gas supply system for supplying gas, such as process gas, in a semiconductor manufacturing apparatus.

Related Art

In coating devices, dry etching devices, and others in a semiconductor manufacturing process, there are used for example a special gas such as silane, a corrosive gas such as chlorine gas, a flammable gas such as hydrogen gas or phosphine. The flow rate of each gas directly affects the quality of products to be manufactured in the semiconductor manufacturing process (hereinafter, also simply referred to as a "process"). Therefore, the flow rate has to be strictly controlled. In particular, in association with recent stacking and miniaturizing of semiconductor substrates, a demand for improved reliability in a process gas supply system has been increased than ever before.

For the semiconductor manufacturing apparatus, for example, a gas flow monitoring apparatus is placed in a process gas line. This process gas line includes a plurality of gas lines. These gas lines are arranged to supply process gas from a process gas supply source to a predetermined process chamber via a first line shut-off valve, a mass flow controller (hereinafter, also referred to as "MFC", which is one example of a flow control device), and a second line shut-off valve. Since a flow rate controlled by the MFC exerts an influence on the process, a gas flow monitoring apparatus is disposed downstream of the MFC in each gas line.

FIG. 10 is a gas circuit diagram of a gas line 110 including a conventional gas flow monitoring apparatus 120. FIG. 11 is a pressure diagram in a gas flow test. As shown in FIG. 10, the gas flow monitoring apparatus 120 is provided with a start shut-off valve 21 for shutting off a flow passage for start of flow measurement, a measurement tank 22, a pressure gauge 23, and a temperature gauge 24. When a flow rate is to be measured, the gas flow monitoring apparatus 120 closes the start shut-off valve 21 to stop supply of process gas. At that time, a first line shut-off valve 12 and a second line shut-off valve 13 are open, and a MFC 10 receives a signal representing a set flow rate from the semiconductor manufacturing apparatus. In this case, as shown in FIG. 11, the process gas flowing from the start shut-off valve 21 to the MFC (one example of a flow control device) 10 is subjected to flow control by the MFC 10 and then flows to a predetermined process chamber 140. Thus, the pressure on an upstream side of the MFC 10 decreases. Therefore, a measurement time $\Delta t$ required from the time when the pressure gauge 23 measures a measurement start pressure P1 to the time when the pressure gauge 23 measures a measurement end pressure P2, and a flow rate of process gas actually controlled by the MFC 10 is calculated by use of a pressure difference $\Delta P$ between the measurement start pressure P1 and the measurement end pressure P2, the measurement time $\Delta t$, and a temperature T measured by the temperature gauge 24. A signal representing the calculated flow rate is transmitted from the gas flow monitoring apparatus 120 to a semiconductor manufacturing apparatus not shown.

In the gas flow monitoring method using the gas flow monitoring apparatus 120, for example, the start shut-off valve 21 is repeatedly opened and closed at predetermined time intervals as shown in FIG. 12. In this case, supply pressure of process gas repeatedly rises and drops. The flow measurement is performed every time when the supply pressure of process gas drops. Each measured result is transmitted from the gas flow monitoring apparatus 120 to a semiconductor manufacturing apparatus not shown. Then, the semiconductor manufacturing apparatus not shown checks the MFC 10 based on a difference between the calculated flow rate and the set flow rate of the MFC 10. Accordingly, the unillustrated semiconductor manufacturing apparatus can maintain a gas flow in a gas supply system and simultaneously constantly monitor the accuracy of flow rate of the MFC 10 by use of the gas flow monitoring apparatus 120 (for example, see Patent Document 1).

RELATED ART DOCUMENTS

Patent Documents

Patent Document 1: JP-A-2013-84857

SUMMARY

Technical Problems

However, the technique disclosed in Patent Document 1 has the following problems. FIG. 13 is a graph plotting the pressure measured by the pressure gauge 23 (called the "test pressure") and the pressure downstream of the MFC 10 (called the "MFC downstream pressure") in one flow measurement while the accuracy of flow rate of the MFC 10 is constantly monitored by the conventional gas flow monitoring method. In this graph, a vertical axis indicates test pressure (kPa) or MFC downstream pressure (kPa), and a horizontal axis indicates time (sec). As shown in FIG. 13, when the start shut-off valve 21 is switched from a valve open state to a valve closed state, the test pressure decreases. Thereafter, when the start shut-off valve 21 is changed from the valve closed state to the valve open state, the test pressure increases and returns to a previous pressure obtained before the flow test. In this regard, in the technique disclosed in Patent Document 1, the MFC 10 constantly regulates a flow rate of the process gas to the set flow rate while the start shut-off valve 21 is opened or closed. Therefore, the start shut-off valve 21 is sometimes opened during execution of the process by the unillustrated semiconductor manufacturing apparatus. In this situation, as shown in a zone X in FIG. 13, the MFC downstream pressure might pulsate when the start shut-off valve 21 is switched from the valve closed state to the valve open state. The reason is because a large pressure difference occurs between a primary side and a secondary side of the start shut-off valve 21 when the start shut-off valve 21 is changed from the valve closed state to the valve open state, thereby causing the process gas to flow into the MFC 10 at a stroke, resulting in variation in output flow of the MFC 10. This variation in output flow of the MFC 10 may affect the process; for instance, the thickness of a film to be formed on a wafer could not be controlled with accuracy.

The present invention has been made to solve the above problems and has a purpose to provide a gas flow monitoring method and a gas flow monitoring apparatus capable of monitoring a flow rate of a flow control device without exerting influence on a semiconductor manufacturing process.

Means of Solving the Problems

To achieve the above purpose, one aspect of the present invention provides a gas flow monitoring method for monitoring a flow rate of a flow control device, the method using: the flow control device for controlling a flow rate of process gas from a process gas supply source and supplying the process gas to a predetermined process chamber; a start shut-off valve placed on an upstream side of the flow control device; and a pressure gauge placed between the start shut-off valve and the flow control device, and the method comprising: closing the start shut-off valve and measuring a decrease in pressure on the upstream side of the flow control device to measure the flow rate of the flow control device; and subsequently opening the start shut-off valve and monitoring the flow rate of the flow control device, wherein the method further includes switching the flow control device from an ON state to an OFF state before opening the start shut-off valve.

According to another aspect of the invention, a gas flow monitoring apparatus comprising: a start shut-off valve placed in a gas line for supplying process gas from a process gas supply source to a predetermined process chamber via a flow control device, the start shut-off valve being located on an upstream side of the flow control device; a pressure gauge placed between the start shut-off valve and the flow control device; and a monitoring controller configured to close the start shut-off valve and measure a decrease in pressure on the upstream side of the flow control device in order to measure a flow rate of the flow control device, wherein the monitoring controller is electrically connected to a semiconductor manufacturing apparatus configured to enable a process to be executed when the flow control device is in an ON state, the semiconductor manufacturing apparatus is configured to switch the flow control device from the ON state to the OFF state and then transmit a flow measurement end signal instructing termination of flow measurement of the flow control device to the monitoring controller to the monitoring controller, and the monitoring controller includes a valve opening unit configured to open the start shut-off valve when the monitoring controller receives the flow measurement end signal from the semiconductor manufacturing apparatus.

According to another aspect of the invention, a gas flow monitoring apparatus comprising: a start shut-off valve placed in a gas line for supplying process gas from a process gas supply source to a predetermined process chamber via a flow control device, the start shut-off valve being located on an upstream side of the flow control device; a pressure gauge placed between the start shut-off valve and the flow control device; and a monitoring controller configured to close the start shut-off valve and measure a decrease in pressure on the upstream side of the flow control device in order to measure a flow rate of the flow control device, wherein the monitoring controller includes: an off command signal input unit configured to receive an off command signal indicating a command to switch the flow control device to the OFF state, from a semiconductor manufacturing apparatus configured to enable a process to be executed when the flow control device is in an ON state, and a valve opening unit configured to open the start shut-off valve after the off command signal input unit receives the off command signal from the semiconductor manufacturing apparatus and the flow rate of the flow control device is measured.

DESCRIPTION OF EMBODIMENTS

A detailed description of typical embodiments of a gas flow monitoring method and a gas flow monitoring apparatus embodying the present invention will now be given referring to the accompanying drawings.

First Embodiment

Herein, the whole structure of a flow monitoring system is first described to clarify the configuration of the present embodiment. Specifically, the structure of the gas flow monitoring apparatus is described first and then the gas flow monitoring method is explained. Operations and advantageous effects of the present embodiment are lastly mentioned.

<Outline Structure of Flow Monitoring System>

Figure 1:
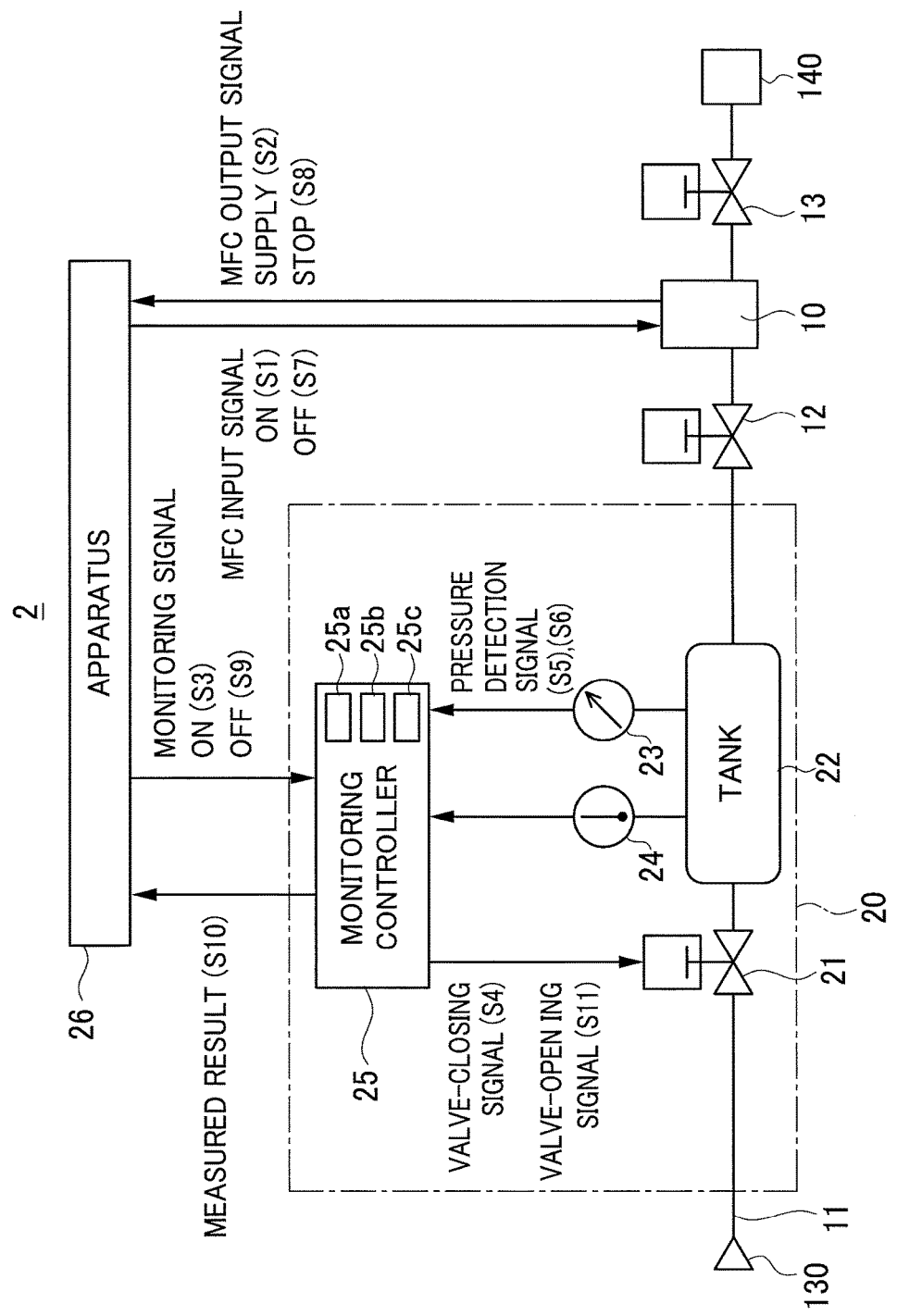
FIG. 1 is a circuit diagram of a gas flow monitoring system including a gas flow monitoring apparatus in a first embodiment of the invention.

FIG. 1 is a circuit diagram of a gas flow monitoring system 2 including the gas flow monitoring apparatus 20 in the first embodiment. The gas flow monitoring apparatus 20 in the first embodiment is placed in a process gas line of a semiconductor manufacturing apparatus 26 in a similar manner to a conventional system. The process gas line includes a plurality of gas lines 11. For instance, as shown in FIG. 1, each gas line 11 is configured to supply process gas from a process gas supply source 130 to a predetermined process chamber 140 via a first line shut-off valve 12, an MFC (one example of a flow control device) 10, and a second line shut-off valve 13. A flow rate of the process gas controlled by the MFC 10 exerts influence on a semiconductor manufacturing process. Accordingly, each gas line 11 is provided with the gas flow monitoring apparatus 20 placed on an upstream side of the MFC 10. The gas lines 11 and the gas flow monitoring system 2 in the present embodiment are similarly configured to the conventional ones. Further, parts or devices of the gas flow monitoring apparatus 20 arranged in each gas line 11 are configured similarly to the conventional ones. In the present embodiment, the gas flow monitoring apparatus 20 includes a monitoring controller 25, and the MFC 10 is switched from an ON state to an OFF state before a start shut-off valve 21 is opened. Thus, the following description will be given with a focus on different features of the gas flow monitoring apparatus 20 and the gas flow monitoring method from the conventional ones.

<Gas Flow Monitoring Apparatus>

As shown in FIG. 1, the gas flow monitoring apparatus 20 is provided with the start shut-off valve 21, a measurement tank 22, a pressure gauge 23, and a temperature gauge 24. The start shut-off valve 21, the pressure gauge 23, and the temperature gauge 24 are each electrically connected to the monitoring controller 25. The monitoring controller 25 includes a monitoring signal detection unit 25a, a valve opening unit 25b, and a flow calculation unit 25c. The monitoring signal detection unit 25a is configured to detect an ON/OFF state of a monitoring signal to command the monitoring controller 25 to calculate a flow rate of the MFC 10. The valve opening unit 25b is configured to open when the monitoring signal detection unit 25a receives the monitoring signal in an "off" state ("OFF-state monitoring signal") from the semiconductor manufacturing apparatus 26. The flow calculation unit 25c is configured to close the start shut-off valve 21 and calculate a flow rate of the MFC 10 when the monitoring signal detection unit 25a detects the monitoring signal in an "on" state ("ON-state monitoring signal"), i.e., when the monitoring signal detection unit 25a receives a flow measurement start signal from the semiconductor manufacturing apparatus 26.

Figure 3:
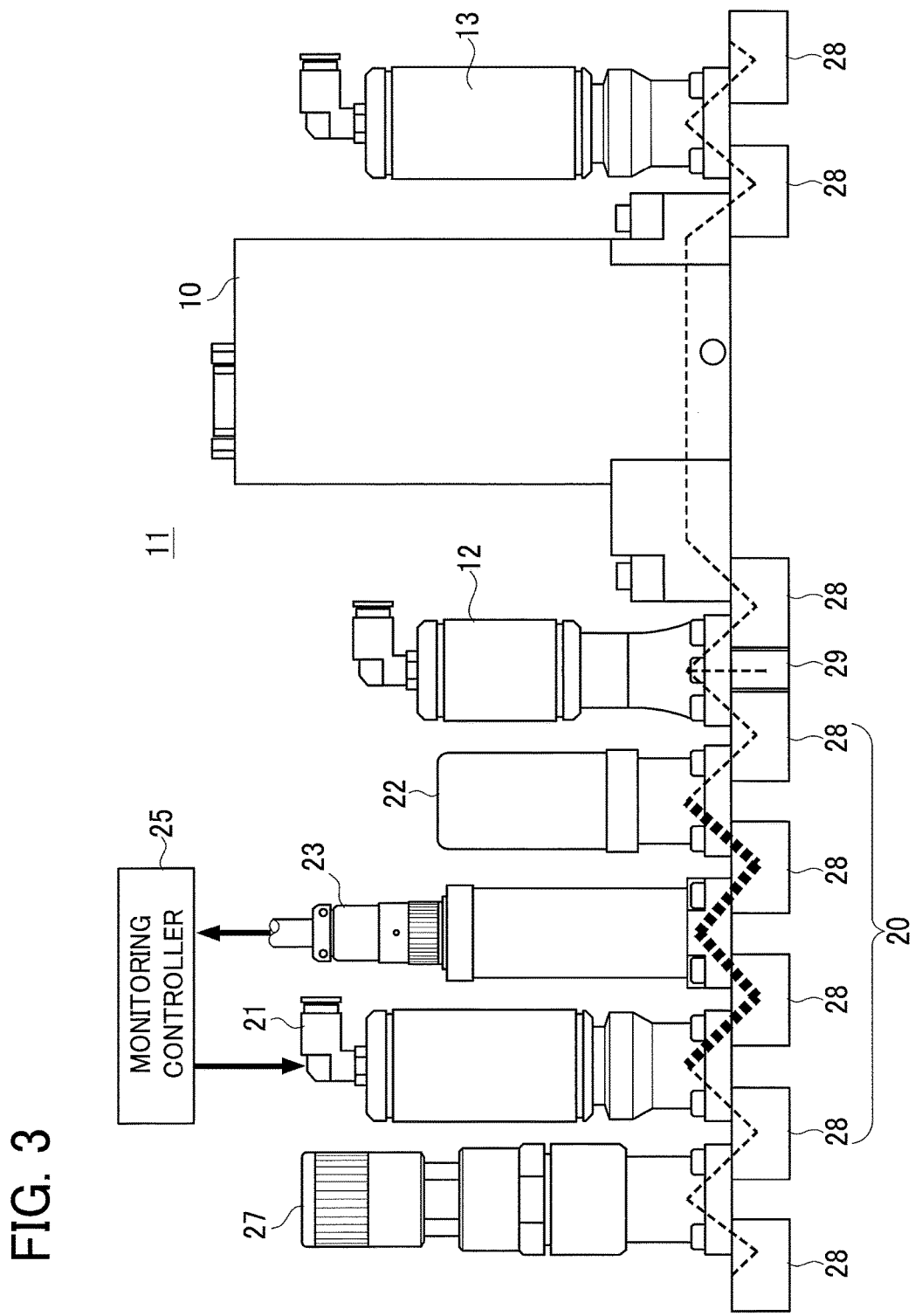
FIG. 3 is a side view of devices or components constituting a gas line including a gas flow monitoring apparatus in the first embodiment.

FIG. 3 is a side view of parts or devices constituting the gas line 11 including the gas flow monitoring apparatus 20 in the first embodiment. Specifically, a regulator 27, the start shut-off valve 21, the pressure gauge 23, the measurement tank 22, the first line shut-off valve 12, the MFC 10, and the second shut-off valve 13 are integrally connected in series through passage blocks 28 formed with V-shaped flow passages and a passage block 29 formed with an L-shaped flow passage. It is to be noted that the temperature gauge 24 is built in the measurement tank 22 and therefore is not illustrated in FIG. 3.

The start shut-off valve 21 is an air-operated valve to supply or stop supplying process gas from the process gas supply source 130 to a downstream side. The measurement tank 22 is a container storing a specific amount of process gas. The capacity of the measurement tank 22 is selected suitably according to a target flow rate of the MFC 10; for example, about a tank capacity of 50 to 60 cc is selected. During gas flow measurement, the process gas stored in the measurement tank 22 flows out, decreasing in gas pressure.

The pressure gauge 23 is configured to measure a drop or decrease in pressure of the process gas stored in the measurement tank 22. In this embodiment, as one example of the pressure gauge 23, a strain gauge type pressure gauge capable of addressing high pressure process gas is used. The temperature gauge 24 is configured to measure the temperature of gas in the measurement tank 22.

The first line shut-off valve 12 is an air-operated valve to selectively supply the process gas supplied through the gas flow monitoring apparatus 20 and the purge gas through the passage block 29 to the downstream side. The second line shut-off valve 13 is an air-operated valve to supply or stop supplying the process gas or the purge gas, which has passed through the MFC 10, to the downstream side. The MFC 10 corresponds to a mass flowmeter (a flowmeter for measuring a mass flow rate) additionally having a function of flow control. The regulator 27 is not illustrated in FIG. 1, but may be placed upstream of the start shut-off valve 21 as shown in FIG. 3. This configuration enables maintaining the gas pressure of the process gas to be supplied to the gas flow monitoring apparatus 20 at a constant pressure.

<Gas Flow Monitoring Method>

Figure 2:
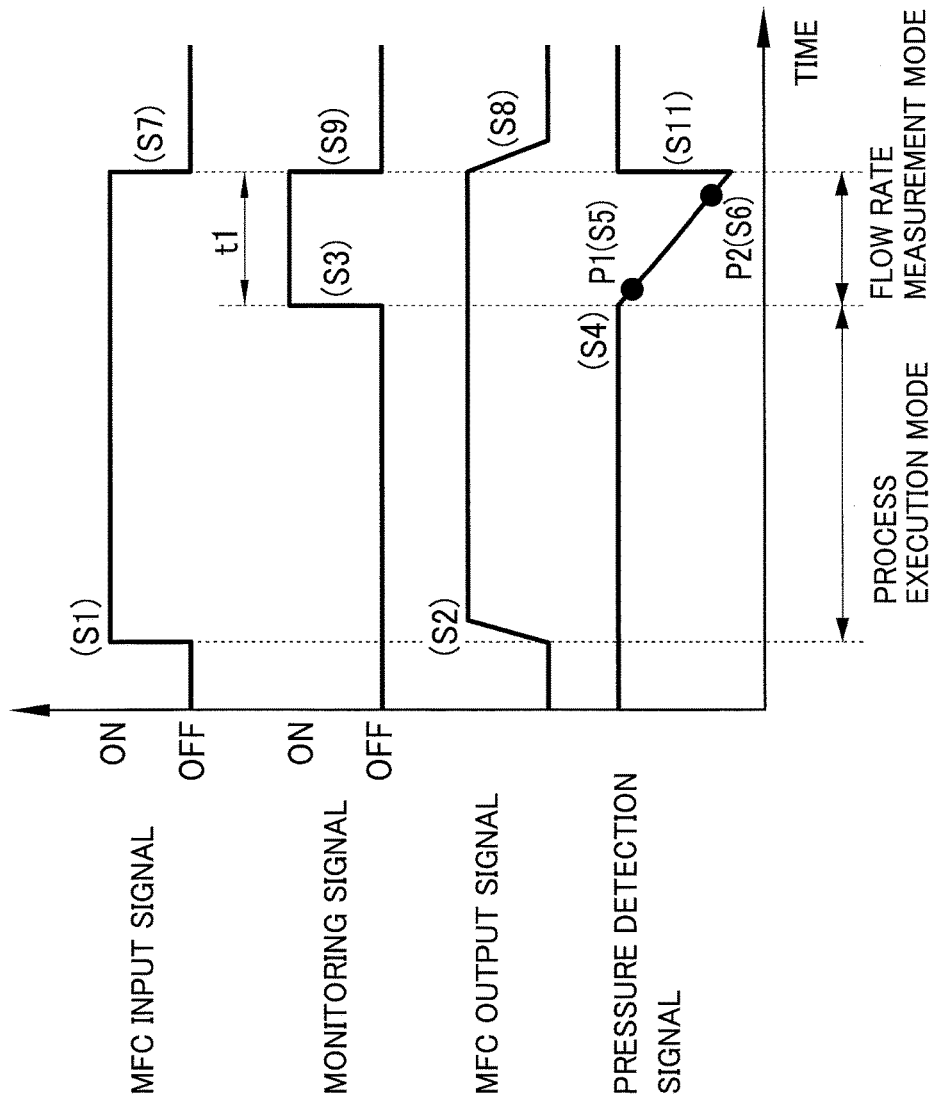
FIG. 2 is a graph showing a gas flow monitoring method in the first embodiment.

The gas flow monitoring method is described below. FIG. 2 is a graph showing the gas flow monitoring method in the first embodiment. This gas flow monitoring method is carried out in-line by using process gas. The gas flow monitoring method is performed by opening and closing the start shut-off valve 21 at predetermined time intervals to repeatedly check a flow rate of the MFC 10.

For supply of the process gas, the gas line 11 is operated in such a manner that the semiconductor manufacturing apparatus 26 turns on an MFC input signal to activate the MFC 10 and transmits this signal to the MFC 10 (see S1 in FIGS. 1 and 2). Accordingly, the MFC 10 starts to control a flow rate of process gas in response to electricity applied to a proportional valve not shown and transmits an MFC output signal to the semiconductor manufacturing apparatus 26 (see S2 in FIGS. 1 and 2). Further, the semiconductor manufacturing apparatus 26 brings the first line shut-off valve 12 into a valve open state. The semiconductor manufacturing apparatus 26 further controls the second line shut-off valve 13 to open or close in order to supply the process gas by a predetermined supply amount to the predetermined process chamber 140. The gas flow monitoring apparatus 20 is configured to hold the start shut-off valve 21 in the valve open state except during flow measurement. Thus, even when the start shut-off valve 21 is placed upstream of the MFC 10, the flow control of the MFC 10 is unaffected. Accordingly, in the gas line 11, the process gas is supplied by a predetermined amount to the predetermined process chamber 140 via the MFC 10. At that time, the monitoring signal is in an OFF state and thus the monitoring controller 25 does not measure a flow rate (see FIG. 2).

When the monitoring signal transmitted from the semiconductor manufacturing apparatus 26 is turned from the OFF state to the OFF state, a process execution mode is switched to a flow test mode, in which the monitoring controller 25 calculates the flow rate of the MFC 10 (see S3 in FIGS. 1 and 2). Specifically, upon receipt of the ON-state monitoring signal (one example of a flow measurement start signal), the monitoring controller 25 first transmits a valve closing signal for closing the start shut-off valve 21 to close the start shut-off valve 21 (see S4 in FIGS. 1 and 2). Accordingly, the process gas is no longer supplied to the downstream side of the start shut-off valve 21, resulting in a pressure drop on the upstream side of the MFC 10. The pressure on the upstream side of the MFC 10 is measured by the pressure gauge 23 placed between the start shut-off valve 21 and the MFC 10. When this pressure measured by the pressure gauge 23 decreases below a measurement start pressure P1, the flow measurement is started (see S5 in FIGS. 1 and 2). When the pressure on the upstream side of the MFC 10 continues to decrease and then the pressure measured by the pressure gauge 23 drops below a measurement end pressure P2, the flow measurement is terminated (see S6 in FIGS. 1 and 2).

The monitoring controller 25 calculates a flow rate of process gas actually controlled by the MFC 10 by a gas state equation expressed by the following expression 1 with the pressure difference ΔP between the measurement start pressure P1 and the measurement end pressure P2, the measurement time Δt required from the measurement start time at which the measurement start pressure P1 is measured and the measurement end time at which the measurement end pressure P2 is measured, the temperature T measured by the temperature gauge 24, a capacity V of the measurement tank 22, a compression factor Z determined depending on the type of the process gas, and a gas constant R determined depending on the type of the process gas:

$$Q = \frac{1}{Z} \times \frac{P1 - P2}{\Delta t} \times \frac{V}{RT} \tag{1}$$

where Q: Flow rate (m³/sec),
P1: Measurement start pressure (Pa),
P2: Measurement end pressure (Pa),
Z: Compression factor,
Δt: Measurement time,
V: Tank capacity (m³),
R: Gas constant (J/mol·K), and
T: Gas temperature (K).

The semiconductor manufacturing apparatus 26 stores a predetermined time t1 required for the monitoring controller 25 to calculate the flow rate Q of the MFC 10 and return the pressure to a previous value. Therefore, the semiconductor manufacturing apparatus 26 turns off the MFC input signal transmitted to the MFC 10 before a lapse of the predetermined time t1 from transmission of the ON-state monitoring signal to the monitoring controller 25. Accordingly, the semiconductor manufacturing apparatus 26 does not perform the process in the gas line 11 for which the MFC input signal is turned off (see S7 in FIGS. 1 and 2). When the MFC input signal is turned off, power supply to the proportional valve built in the MFC 10 is stopped and thus the MFC 10 stops outputting the MFC output signal to the semiconductor manufacturing apparatus 26 (see S8 in FIGS. 1 and 2). Thus, the flow rate of process gas is no longer controlled by the MFC 10. After that, the semiconductor manufacturing apparatus 26 turns the monitoring signal transmitted to the monitoring controller 25 to the OFF state (see S9 in FIGS. 1 and 2). Upon receipt of the OFF-state monitoring signal (one example of the measurement end signal) from the semiconductor manufacturing apparatus 26, the monitoring controller 25 recognizes that the flow measurement of the MFC 10 is terminated.

Subsequently, the monitoring controller 25 transmits a signal representing the calculated flow rate Q to the semiconductor manufacturing apparatus 26 (see S10 in FIG. 1). The monitoring controller 25 also transmits the valve opening signal to the start shut-off valve 21 to open the start shut-off valve 21 (see S11 in FIGS. 1 and 2). Thus, the pressure on the upstream side of the MFC 10 returns to the previous pressure. Since a large pressure difference occurs between the pressure on the upstream side and the pressure on the downstream side of the start shut-off valve 21 before this valve 21 is opened, opening of the start shut-off valve 21 causes the process gas to burst into the MFC 10, and accordingly the output flow of the MFC 10 pulsates. At that time, the semiconductor manufacturing apparatus 26 holds the MFC 10 in the OFF state and therefore the process is disabled. Thus, even if the output of the MFC 10 varies when the start shut-off valve 21 is opened, such variation does not adversely affect the process executed by the semiconductor manufacturing apparatus 26.

Upon receipt of the signal indicating the flow rate Q from the monitoring controller 25, the semiconductor manufacturing apparatus 26 checks the flow rate Q by comparing the flow rate Q with the set flow rate of the MFC 10. If the flow rate Q falls within an acceptable range relative to the set flow rate, the semiconductor manufacturing apparatus 26 determines the MFC 10 to be normal. In contrast, if the flow rate Q is out of the acceptable range relative to the set flow rate, the semiconductor manufacturing apparatus 26 judges the MFC 10 to be abnormal. When detecting the abnormality of the MFC 10, the semiconductor manufacturing apparatus 26 then calculates a correction value for correcting the set flow rate of the MFC 10 or indicates an operator the abnormality of the MFC 10.

Figure 12:
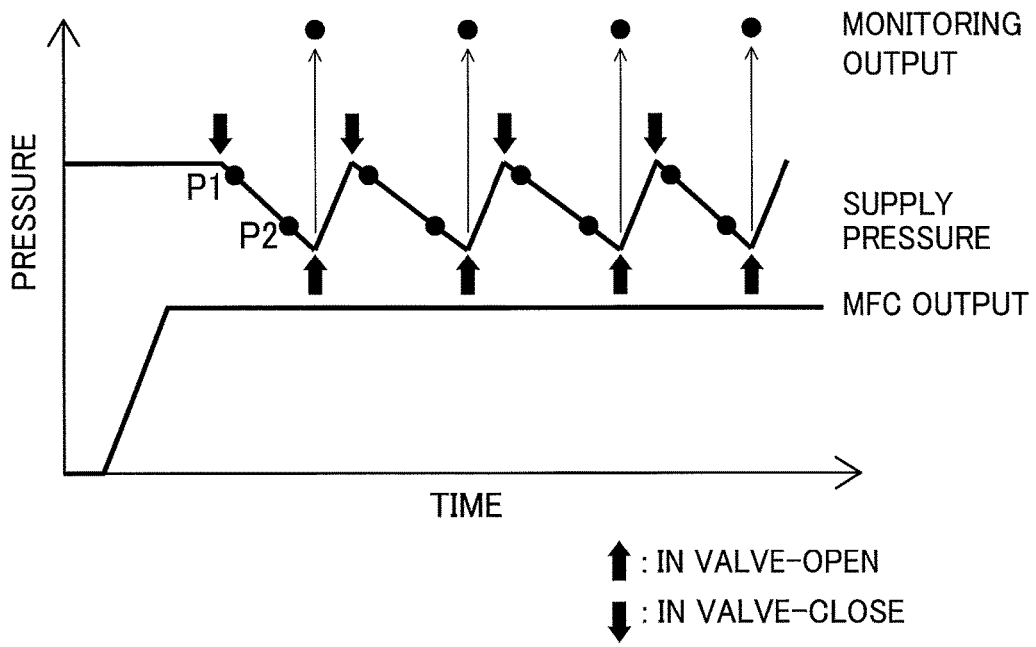
FIG. 12 is a pressure diagram when flow-rate accuracy of a flow control device (MFC) is constantly monitored by a gas flow monitoring apparatus.
Figure 13:
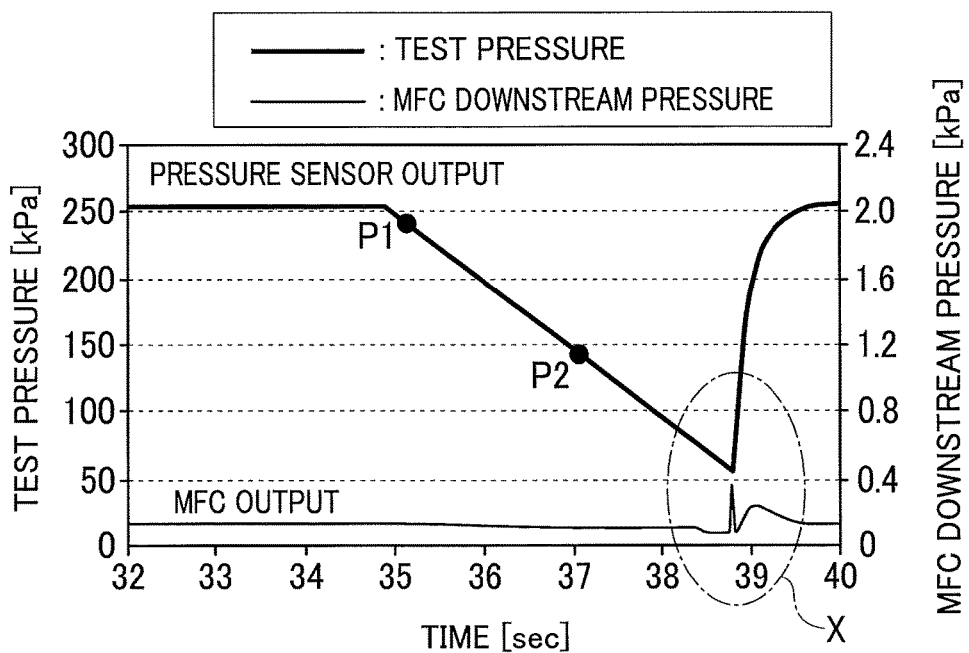
FIG. 13 is a graph plotting pressure measured by a pressure gauge (test pressure) and pressure downstream of a flow control device (MFC) (MFC downstream pressure) in one flow test, when flow-rate accuracy of the flow control device (MFC) is constantly monitored by a conventional gas flow monitoring method.

Next, an explanation is given to a method for constantly monitoring the accuracy of flow rate of the MFC 10 using the gas flow monitoring apparatus 20. For instance, as shown in FIG. 12, the start shut-off valve 21 is sequentially opened and closed at predetermined time intervals by a command from the monitoring controller 25 during operation of the semiconductor manufacturing apparatus 26. In this case, the supply pressure of process gas to be supplied to the predetermined process chamber 140 repeatedly rises and drops. The gas flow monitoring apparatus 20 calculates the flow rate Q from the pressure drop amount and the length of time for the pressure drop, every time when the gas supply pressure decreases, as described above. The calculated flow rate Q is transmitted as a monitoring output value from the monitoring controller 25 to the semiconductor manufacturing apparatus 26. The time interval at which rising and falling of the gas supply pressure is repeated can be set arbitrarily, for example, in a range from several seconds to several tends of seconds.

The gas flow monitoring apparatus 20 may cause variation in the pressure on the upstream side of the MFC 10 every time the start shut-off valve 21 is opened. However, before opening the start shut-off valve 21 after flow measurement, the gas flow monitoring apparatus 20 switches the MFC 10 into the OFF state so that the process is not performed. For this purpose, the gas flow monitoring apparatus 20 is placed upstream of the MFC 10 of a process gas supply system to constantly monitor the accuracy of the flow rate of the MFC 10 based on the flow rate Q received from the monitoring controller 25 while maintaining a process gas flow in the process gas supply system. Accordingly, even when the pressure on the upstream side of the MFC 10 pulsates every time the start shut-off valve 21 is opened, such variation does not affect the process.

<Operations and Advantageous Effects>

In the gas flow monitoring method in the first embodiment, as described above, using the MFC (one example of the flow control device) 10 for controlling a flow rate of process gas from the process gas supply source 130 and supplying the process gas to the predetermined process chamber 140, the start shut-off valve 21 placed upstream of the MFC 10, and the pressure gauge 23 placed between the start shut-off valve 21 and the MFC 10, the method including closing the start shut-off valve 21 and measuring a pressure decrease on the upstream side of the MFC 10 by use of the pressure gauge 23 to measure the flow rate of the MFC 10 and subsequently opening the start shut-off valve 21 and monitoring the flow rate of the MFC 10, the MFC 10 is switched from the ON state to the OFF state before the start shut-off valve 21 is opened. Thus, this method enables in-line monitoring the flow rate of the MFC 10 without affecting the process.

To be concrete, according to the aforementioned gas flow monitoring method, when the start shut-off valve 21 placed upstream of the MFC 10 is closed, the pressure on the downstream side of the start shut-off valve 21 decreases according to the flow rate controlled by the MFC 10. At that time, the pressure gauge 23 placed between the start shut-off valve 21 and the MFC 10 measures a decrease in pressure on the upstream side of the MFC 10. Therefore, the flow rate of the MFC 10 is measured based on the decrease in pressure measured by the pressure gauge 23. Upon termination of the measurement of the flow rate of the MFC 10, the start shut-off valve 21 is opened. Thus, the process gas is supplied again to the MFC 10, so that the pressure on the upstream side of the MFC 10 returns to a previous pressure.

In the above case, the gas flow monitoring method switches the MFC 10 from the ON state to the OFF state before opening the start shut-off valve 21. Consequently, even when the start shut-off valve 21 is opened while a large pressure difference occurs between the primary side pressure and the secondary side pressure of the start shut-off valve 21, causing the process gas to flow at once toward the MFC 10, resulting in variation in the output flow of the MFC 10, the MFC 10 remains in the OFF state. In this OFF state of the MFC 10, the process is not performed. According to the gas flow monitoring method in the present embodiment, therefore, even if the output of the MFC 10 varies when the start shut-off valve 21 is opened after measurement of the flow rate of the MFC 10, the variation does not affect the process.

In the gas flow monitoring method in the first embodiment, furthermore, there are used the monitoring controller 25 electrically connected to the start shut-off valve 21 and the pressure gauge 23, and the semiconductor manufacturing apparatus 26 electrically connected to the monitoring controller 25 and the MFC 10. After the monitoring controller 25 measures the flow rate of the MFC 10, the semiconductor manufacturing apparatus 26 switches the MFC 10 from the ON state to the OFF state and then transmits, to the monitoring controller 25, the flow measurement end signal (the OFF-state monitoring signal) instructing termination of the flow measurement of the MFC 10. Upon receipt of the flow measurement end signal (the OFF-state monitoring signal) from the semiconductor manufacturing apparatus 26, the monitoring controller 25 closes the start shut-off valve 21. Accordingly, variation in process gas supply pressure occurring when the start shut-off valve 21 is opened does not affect the process. To be concrete, the semiconductor manufacturing apparatus 26 stores the predetermined time t1 required for the monitoring controller 25 to measure the flow rate and switches the MFC 10 to the OFF state before the monitoring controller 25 opens the start shut-off valve 21, so that execution of the process is disabled. According to the embodiment, therefore, even when the output flow of the MFC 10 varies or fluctuates when the start shut-off valve 21 is opened, the variation does not affect the process.

The gas flow monitoring apparatus 20 in the first embodiment includes: the start shut-off valve 21 placed, upstream of the MFC (one example of the flow control device) 10, in the gas line 11 for supplying the process gas from the process gas supply source 130 to the predetermined process chamber 140 via the MFC 10; the pressure gauge 23 placed between the start shut-off valve 21 and the MFC 10; and the monitoring controller 25 configured to close the start shut-off valve 21 and measure a decrease in pressure on the upstream side of the MFC 10 by use of the pressure gauge 23 to measure the flow rate of the MFC 10. The monitoring controller 25 is electrically connected to the semiconductor manufacturing apparatus 26 configured to enable execution of the process when the MFC 10 is in the OFF state. Before the predetermined time t1 elapses from the time of instructing the start of flow measurement of the MFC 10 to the monitoring controller 25 but after the flow measurement is terminated, the semiconductor manufacturing apparatus 26 switches the MFC 10 from the ON state to the OFF state and transmits the flow measurement end signal instructing termination, or stop, of the flow measurement of the MFC 10 to the monitoring controller 25. The monitoring controller 25 includes the valve opening unit 25b configured to open the start shut-off valve 21 upon receipt of the flow measurement end signal (the OFF-state monitoring signal) from the semiconductor manufacturing apparatus 26. Accordingly, the gas flow monitoring apparatus 20 configured as above can monitor in-line the flow rate of the MFC 10 without affecting the process.

To be concrete, the gas flow monitoring apparatus 20 in the first embodiment can monitor in-line the flow rate of the MFC 10 by utilizing the process gas as in the aforementioned gas flow monitoring method. In this case, the semiconductor manufacturing apparatus 26 can stores the predetermined time t1 required for the monitoring controller 25 to measure the flow rate of the MFC 10 and return the pressure to a previous pressure. Before a lapse of the predetermined time t1 from when the semiconductor manufacturing apparatus 26 commands the monitoring controller 25 to start the flow measurement of the MFC 10 (i.e., transmits the ON-state monitoring signal to the monitoring controller 25), the semiconductor manufacturing apparatus 26 switches the MFC 10 from the ON state to the OFF state. Further, after the predetermined t1 has elapsed, the semiconductor manufacturing apparatus 26 transmits, to the monitoring controller 25, the flow measurement end signal (the OFF-state monitoring signal) instructing termination, or stop, of the flow measurement of the MFC 10. Then, the monitoring controller 25 opens the start shut-off valve 21. Therefore, before the monitoring controller 25 opens the start shut-off valve 21, the MFC 10 is changed over from the ON state to the OFF state by the semiconductor manufacturing apparatus 26. Since the MFC 10 is in the OFF state, even when the start shut-off valve 21 is opened while a large pressure difference occurs between the primary side pressure and the secondary side pressure of the start shut-off valve 21, causing the process gas to flow at a stroke to the MFC 10, resulting in variation in output thereof, the semiconductor manufacturing apparatus 26 does not perform the process. In other words, the process is not executed while the output flow of the MFC 10 varies at the time of opening the start shut-off valve 21. Consequently, when the gas flow monitoring apparatus 20 measures the flow rate of the MFC 10 and then opens the start shut-off valve 21, even if the output flow of the MFC 10 is caused to vary, this variation does not affect the process.

The gas flow monitoring method and the gas flow monitoring apparatus 20 in the first embodiment are configured to simply control the MFC 10 to be switched from the ON state to the OFF state before opening the start shut-off valve 21, thereby preventing variation in supply pressure of process gas occurring when the start shut-off valve 21 is changed from the valve closed state to the valve open state from affecting the process. This makes it possible to measure the flow rate of process gas without changing the structure of an existing gas line 11, that is, without changing the size of the existing gas line 11. Further, such a control of simply transmitting the OFF-state MFC input signal from the semiconductor manufacturing apparatus 26 to the MFC 10. Therefore, an existing gas flow monitoring apparatus can be adapted at low cost to add the function of performing flow measurement so that the variation in supply pressure of the process gas does not affect the process.

Moreover, in the gas flow monitoring method and the gas flow monitoring apparatus 20 in the first embodiment, the semiconductor manufacturing apparatus 26 or the monitoring controller 25 stores the calculated flow rate Q, so that abnormality of MFC 10 can be estimated based on the variation in the flow rate Q.

Second Embodiment

Figure 4:
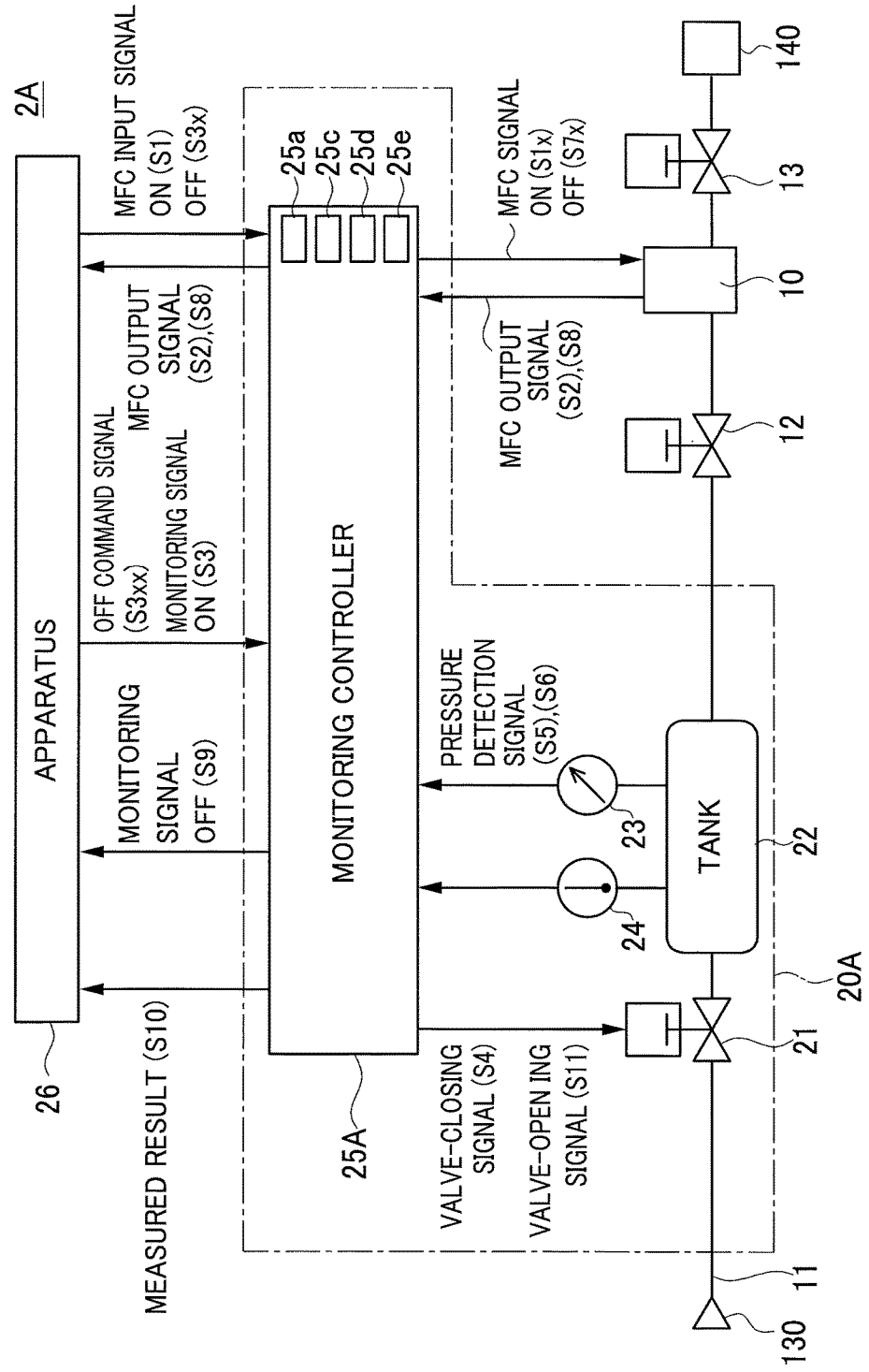
FIG. 4 is a circuit diagram of a gas flow monitoring system including a gas flow monitoring apparatus in a second embodiment.
Figure 5:
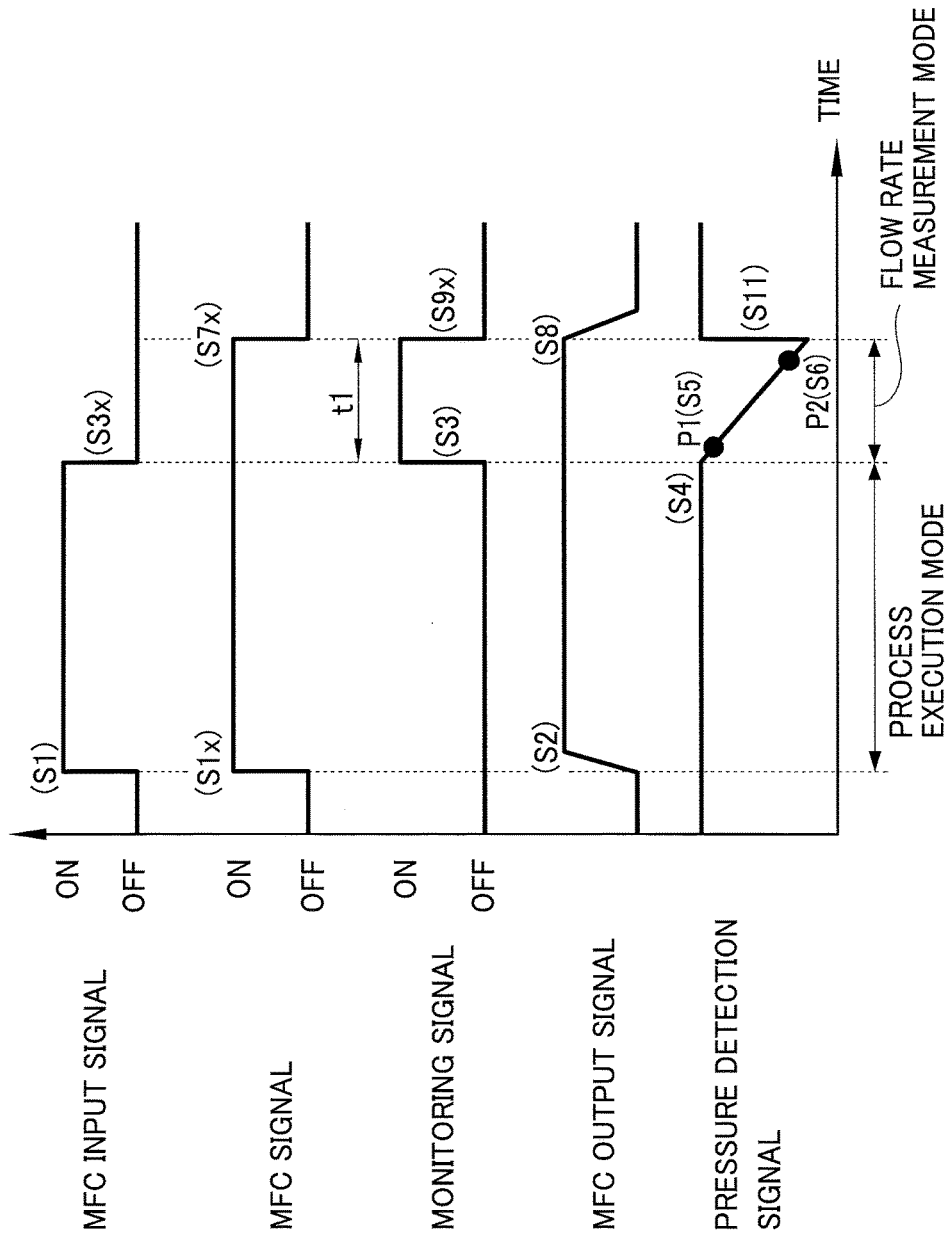
FIG. 5 is a graph showing a gas flow monitoring method in the second embodiment.

A second embodiment of the invention will be described below. FIG. 4 is a circuit diagram of a gas flow monitoring system 2A including a gas flow monitoring apparatus 20A in the second embodiment. FIG. 5 is a graph showing a gas flow monitoring method in the second embodiment.

The gas flow monitoring method and the gas flow monitoring apparatus 20A in the second embodiment are different from those in the first embodiment in that a monitoring controller 25A is provided to switch the MFC 10 from the ON state to the OFF state. Thus, the following description will be given with a focus on the differences from the first embodiment. Similar or identical parts to those in the first embodiment are assigned the same reference signs as those in the first embodiment and their details are appropriately omitted.

The monitoring controller 25A is electrically connected to the MFC 10 as well as the start shut-off valve 21, the pressure gauge 23, and the temperature gauge 24. The monitoring controller 25A includes an off command signal input unit 25d and a valve opening unit 25e in addition to the monitoring signal detection unit 25a and the flow calculation unit 25c. The off command signal input unit 25d is configured to receive an off command signal for switching the MFC 10 to the OFF state from the semiconductor manufacturing apparatus 26 configured to enable execution of the process when the MFC 10 is in the ON state. The valve opening unit 25e is configured to open the start shut-off valve 21 when the off command signal input unit 25d receives the off command signal from the semiconductor manufacturing apparatus 26 and the flow rate of the MFC 10 has been measured. In the present embodiment, the MFC 10 is operated in response to a signal transmitted from the monitoring controller 25A.

A method for monitoring a flow rate of process gas by use of the gas flow monitoring apparatus 20A is described below. The semiconductor manufacturing apparatus 26 causes the monitoring controller 25A to measure the flow rate of the MFC 10 in each process and checks the flow rate of the MFC 10 based on a measured result. In the gas line 11, when the semiconductor manufacturing apparatus 26 transmits an MFC input signal in an ON state to the monitoring controller 25A and also the monitoring controller 25A transmits an MFC signal in an ON state to the MFC 10, gas control during the process is carried out.

In the case of measuring the flow rate of process gas, the semiconductor manufacturing apparatus 26 transmits the MFC input signal in the ON state to the monitoring controller 25A (see S1 in FIGS. 4 and 5). This signal causes the monitoring controller 25A to control the operation of the MFC 10. Specifically, the monitoring controller 25A turns the MFC signal for activating the MFC 10 to the ON state and transmits this ON-state signal to the MFC 10 (see S1x in FIGS. 4 and 5). At that time, the monitoring controller 25A transmits the MFC signal to the MFC 10 in accordance with a parameter (a set flow rate of the MFC 10) included in the MFC input signal transmitted from the semiconductor manufacturing apparatus 26 to control a proportional valve built in the MFC 10 (see S2 in FIGS. 4 and 5).

The semiconductor manufacturing apparatus 26 then transmits an off command signal to the monitoring controller 25A (see S3xx in FIG. 4). Further, the semiconductor manufacturing apparatus 26 transmits a monitoring signal in an ON state (a flow measurement start signal) to the monitoring controller 25A (see S3 in FIGS. 4 and 5). In response to those signals, the monitoring controller 25A is caused to calculate the flow rate of the MFC 10 and then switch the MFC 10 from the ON state to the OFF state. After transmitting the monitoring signal in the ON state to the monitoring controller 25A, the semiconductor manufacturing apparatus 26 turns the MFC input signal to an OFF state (see S3x in FIGS. 4 and 5). The monitoring controller 25A has stored parameters required to control the operation of the MFC 10. Even after the MFC input signal is turned to the OFF state, accordingly, the monitoring controller 25A can make the MFC 10 continuously operate. When the monitoring signal detection unit 25a of the monitoring controller 25A detects the ON-state monitoring signal (the flow measurement start signal), a process execution mode is switched to a flow rate measurement mode. Then, the monitoring controller 25A causes the flow calculation unit 25c to close the start shut-off valve 21 and detects a decrease in the pressure on the upstream side of the MFC 10 from readings of the pressure gauge 23 to calculate a flow rate Q for which the MFC 10 actually controls the process gas (see S4 to S6 in FIGS. 4 and 5).

In the monitoring controller 25A, when the flow calculation unit 25c calculates the flow rate Q, the off command signal input unit 25d turns the MFC signal to an OFF state (see S7x in FIGS. 4 and 5) in response to the off command signal transmitted from the semiconductor manufacturing apparatus 26. Accordingly, the MFC 10 is switched to the OFF state (see S8 in FIGS. 4 and 5). Further, the monitoring controller 25A transmits the monitoring signal in an OFF state (the flow measurement end signal) to the semiconductor manufacturing apparatus 26 (see S9x in FIGS. 4 and 5). Thus, the MFC output signal is interrupted and the semiconductor manufacturing apparatus 26 does not perform the process in the gas line 11. The monitoring controller 25A thus transmits a signal representing a calculated flow rate Q to the semiconductor manufacturing apparatus 26 (see S10 in FIG. 4). The monitoring controller 25A then transmits a valve opening signal to the start shut-off valve 21 to open this valve 21 and thereby return the secondary pressure of the start shut-off valve 21 (the pressure on the upstream side of the MFC 10) to a previous pressure (see S11 in FIGS. 4 and 5). The output flow of the MFC 10 pulsates at the time of opening the start shut-off valve 21 because of a large difference in pressure between the upstream side and the downstream side of the start shut-off valve 21. At that time, the semiconductor manufacturing apparatus 26 is in a disabled state in which the process is not performed and the MFC 10 is in the OFF state. Even when the output flow of the MFC 10 varies when the start shut-off valve 21 is opened, therefore, such variation does not adversely affect the process in the semiconductor manufacturing apparatus 26.

As described above, the gas flow monitoring method in the second embodiment provides the following operations and advantageous effects in addition to those obtained by the gas flow monitoring method in the first embodiment. Specifically, the method uses the monitoring controller 25A electrically connected to the semiconductor manufacturing apparatus 26, the start shut-off valve 21, the pressure gauge 23, and the gas flow monitoring method 10. When the monitoring controller 25A receives the off command signal (the OFF-state MFC input signal) for switching the MFC 10 from the ON state to the OFF state and the flow measurement start signal (the ON-state monitoring signal) for starting the flow measurement of the MFC 10, from the semiconductor manufacturing apparatus 26, the monitoring controller 25A closes the start shut-off valve 21 and measures the flow rate of the MFC, and then switches the MFC 10 from the ON state to the OFF state and thereafter opens the start shut-off valve 21. Accordingly, variation in process gas supply pressure caused at the time of opening the start shut-off valve 21 is unlikely to exert influence on the process. To be concrete, the monitoring controller 25A receives the off command signal and the flow measurement start signal (the OFF-state monitoring signal) from the semiconductor manufacturing apparatus 26 before flow measurement, and switches the MFC 10 to the OFF state before opening the start shut-off valve 21. According to the above configuration, therefore, even when the output of the MFC 10 varies when the start shut-off valve 21 is opened, such variation exerts no influence on the process.

Moreover, the gas flow monitoring apparatus 20A in the second embodiment is provided with the start shut-off valve 21 placed upstream of the MFC 10 in the gas line 11 for supplying the process gas from the process gas supply source 130 to the predetermined process chamber 140 via the MFC 10, the pressure gauge 23 placed between the start shut-off valve 21 and the MFC 10, and the monitoring controller 25A configured to close the start shut-off valve 21 and measure a decrease in the pressure on the upstream side of the MFC 10 through the use of the pressure gauge 23 to thereby measure the flow rate of the MFC 10. The monitoring controller 25A includes the off command signal input unit 25d configured to receive the off command signal indicating a command to switch the MFC 10 to the OFF state from the semiconductor manufacturing apparatus 26 that enables execution of the process when the MFC 10 is in the ON state, and the valve opening unit 25e configured to open the start shut-off valve 21 only when the off command signal input unit 25d receives the off command signal from the semiconductor manufacturing apparatus 26 and the flow rate of the MFC 10 is measured. Accordingly, the flow rate of the MFC 10 can be monitored in-line without affecting the process.

Concretely, the aforementioned gas flow monitoring apparatus 20A switches the MFC 10 from the ON state to the OFF state before the monitoring controller 25A opens the start shut-off valve 21. Accordingly, even when the start shut-off valve 21 is opened when a large pressure difference occurs between the primary pressure and the secondary pressure of the start shut-off valve 21, causing the process gas to flow into the MFC 10 at a stroke, resulting in variation in output flow of the MFC 10, the MFC 10 remains in the OFF state. When the MFC 10 is in the ON state, the semiconductor manufacturing apparatus 26 performs the process upon receipt of the MFC output signal from the monitoring controller 25A. In other words, the semiconductor manufacturing apparatus 26 does not execute the process while the MFC 10 is in the OFF state. Consequently, even when the output flow of the MFC 10 varies when the start shut-off valve 21 is opened after measurement of the flow rate of the MFC 10, this output variation exerts no influence on the process in the semiconductor manufacturing apparatus 26.

The foregoing embodiments are mere examples and give no limitation to the present invention. The present invention may be embodied in other specific forms without departing from the essential characteristics thereof.

(1) For instance, in the above first and second embodiments, the semiconductor manufacturing apparatus 26 checks the MFC 10 based on the flow rate Q calculated from the monitoring controller 25, 25A. As an alternative, the monitoring controller 25, 25A may be configured to check the MFC 10 and transmit a check result to the semiconductor manufacturing apparatus 26.

Figure 6:
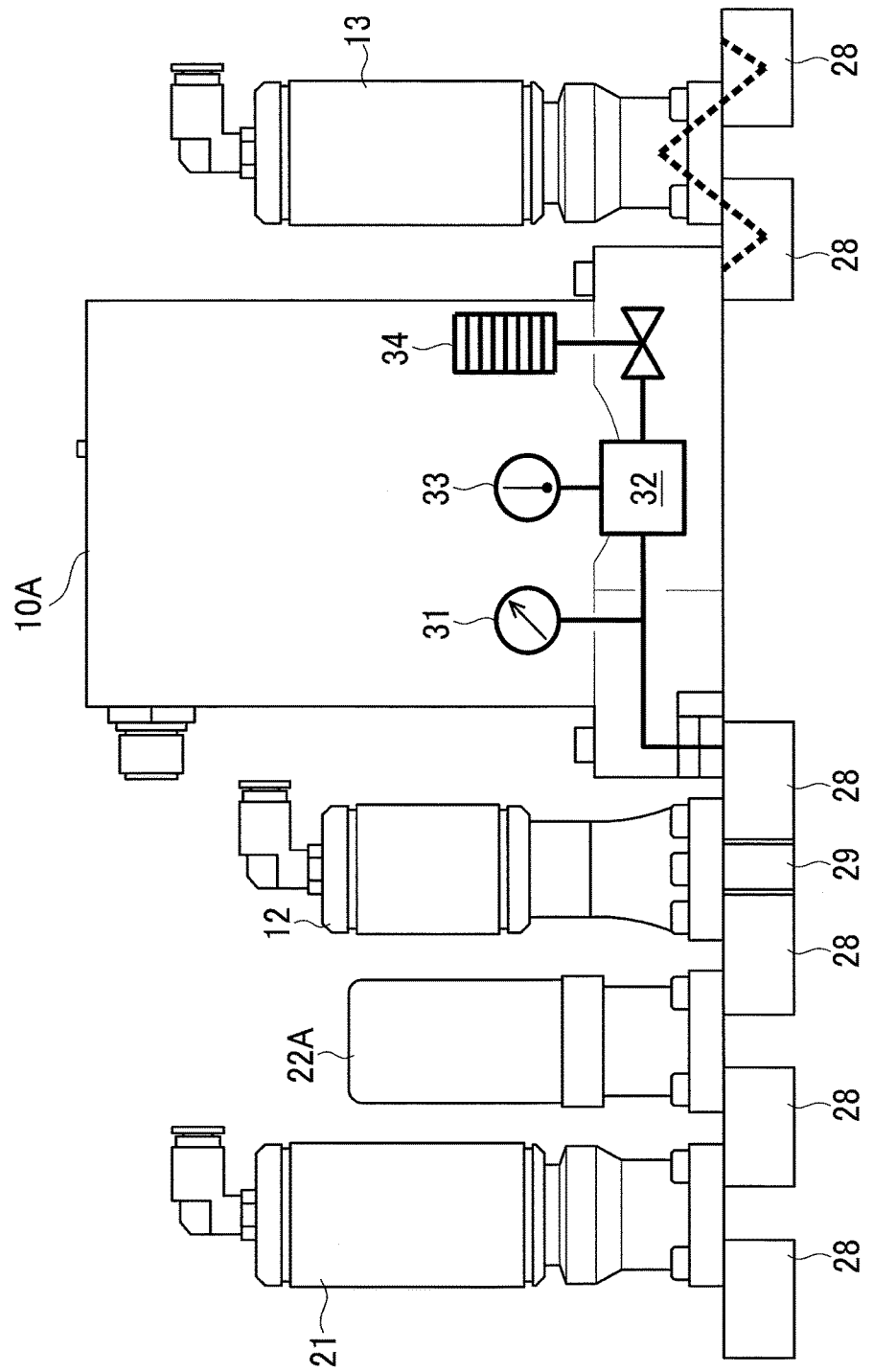
FIG. 6 is a side view of devices or components constituting a gas line including a gas flow monitoring apparatus in a first modified example.
Figure 7:
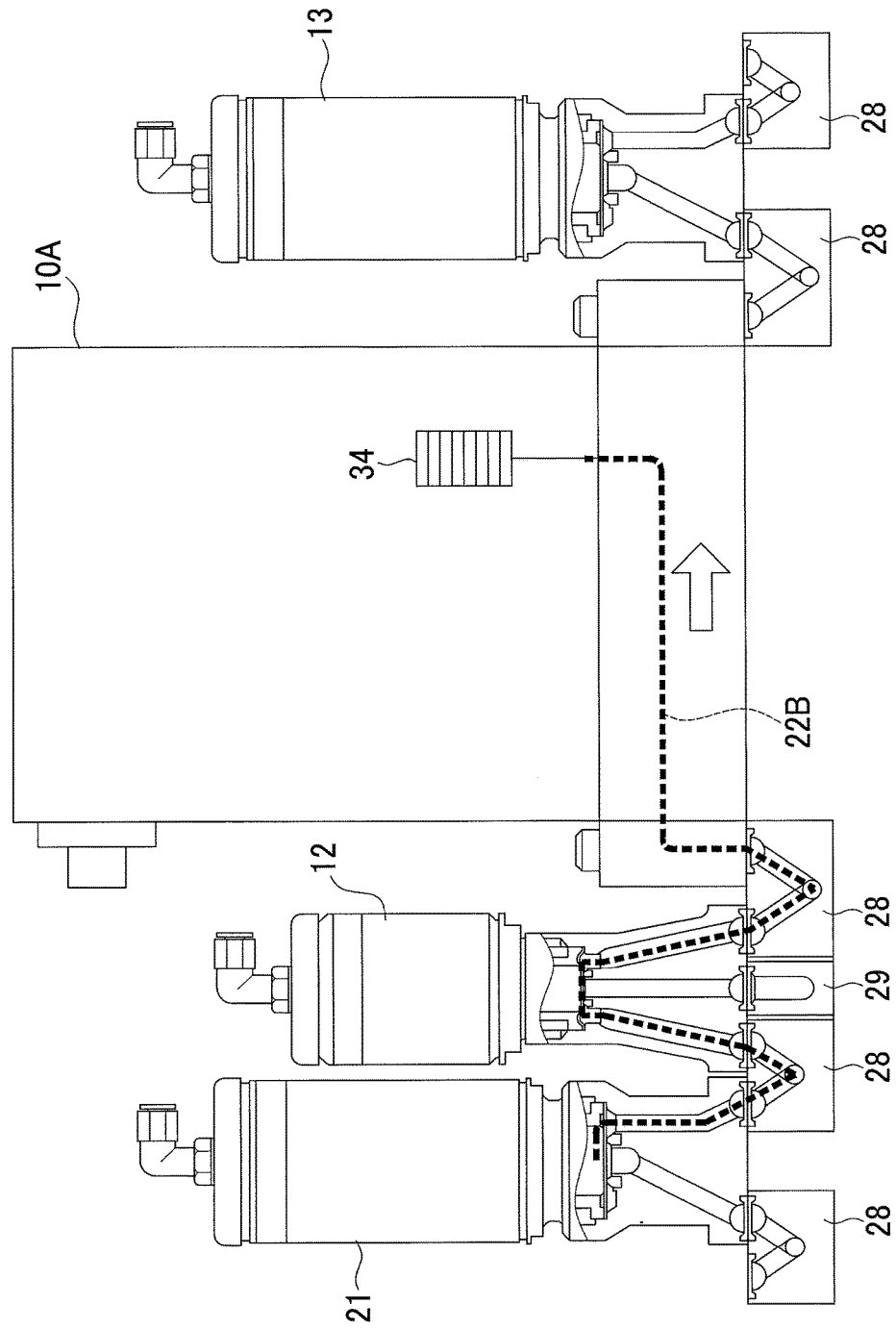
FIG. 7 is a side view of devices or components constituting a gas line including a gas flow monitoring apparatus in a second modified example.

(2) For instance, a first modified example and a second modified example are shown in FIGS. 6 and 7 respectively. In these examples, the MFC 10 in the aforementioned embodiments may be replaced by a pressure insensitive MFC (hereinafter referred to as PIMFC) 10A internally containing a pressure gauge 31, a temperature gauge 32, a flowmeter 33, and a proportional valve 34. Since the flow measurement is performed by use of the pressure gauge 31 and the temperature gauge 32 built in the PIMFC, there is no need to separately install the pressure gauge 23 and the temperature gauge 24 provided in the aforementioned embodiment. This achieves a compact size of the gas flow monitoring apparatus 20 and 20A.

(3) In the aforementioned embodiments, for example, the measurement tank 22 is placed in the flow passage. As an alternative, as shown in a second modified example in FIG. 7, for instance, for a small amount of control flow rate of process gas, the flow passage extending from a valve chamber of the start shut-off valve 21 to the proportional valve 34 of the MFC 10A may be utilized as a measurement tank 22B (see a path indicated by a broken line in FIG. 7). In this case, a tank installation area is unnecessary, so that the gas flow monitoring apparatus 20 and 20A can be designed to be compact.

(4) For instance, in the aforementioned embodiments, the flow measurement start signal indicating a command to start flow measurement and the flow measurement end signal instructing termination of flow measurement are defined by the ON/OFF state of the monitoring signal. Alternatively, the flow measurement start signal and the flow measurement end signal may be independently tuned on and off.

Figure 8:
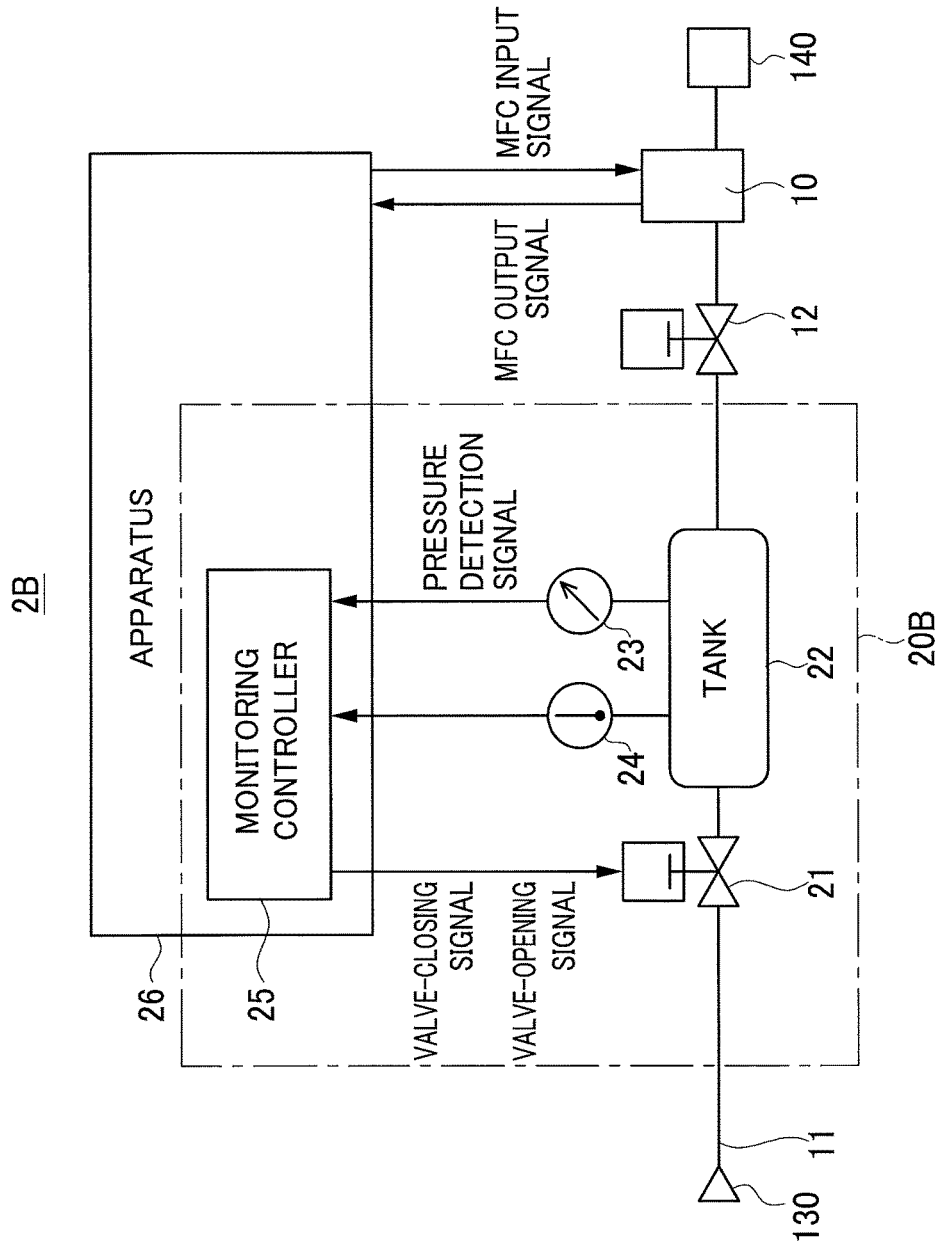
FIG. 8 is a circuit diagram of a gas flow monitoring system including a gas flow monitoring apparatus in a third modified example.
Figure 9:
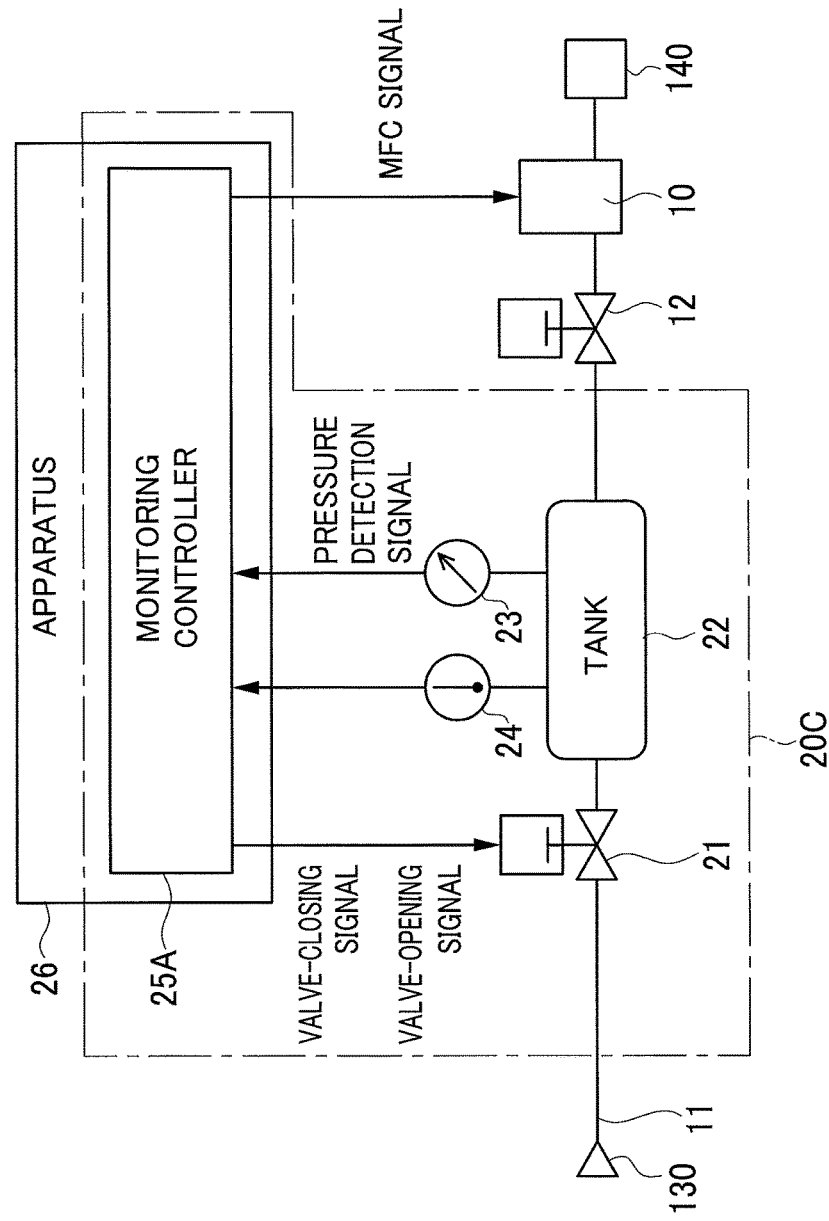
FIG. 9 is a circuit diagram of a gas flow monitoring system including a gas flow monitoring apparatus in a fourth modified example.
Figure 10:
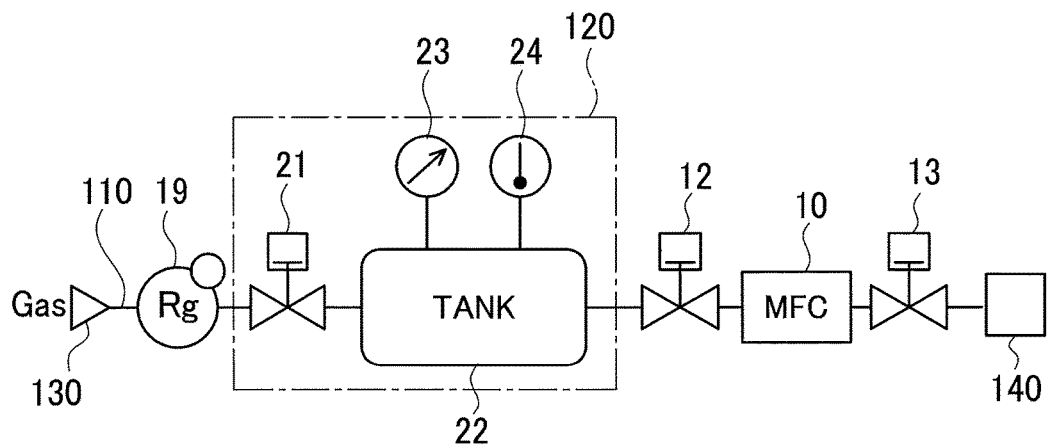
FIG. 10 is a gas circuit diagram of a gas line including a conventional gas flow monitoring apparatus.
Figure 11:
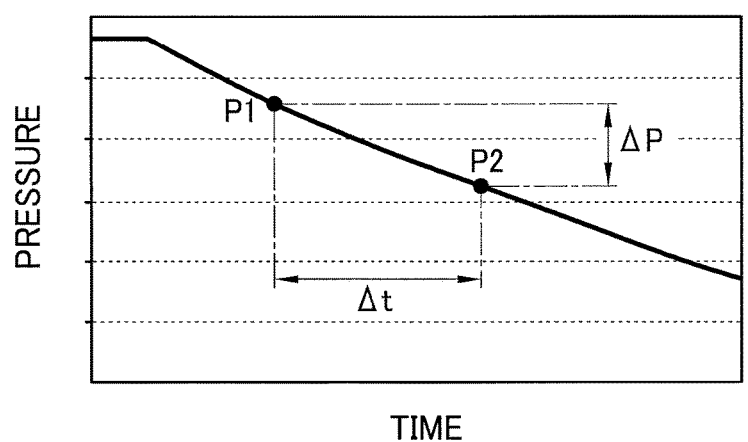
FIG. 11 is a pressure diagram during a gas flow test.

(5) For instance, the semiconductor manufacturing apparatus 26 may be configured to have the function of the monitoring controller 25 or 25A to constitute a gas flow monitoring apparatus 20B or 20C as shown in a gas flow monitoring system 2B or 2C in FIG. 8 or 9.

(6) For instance, in the aforementioned second embodiment, the semiconductor manufacturing apparatus 26 transmits the off command signal to the monitoring controller 25A and then transmits the MFC input signal in the OFF state to the monitoring controller 25A. As an alternative, the monitoring controller 25A may be configured such that the off command signal input unit 25d judges to have received an off command signal indicating a command to switch the MFC 10 to the OFF state when the MFC input signal transmitted from the semiconductor manufacturing apparatus 26 is turned from the ON state to the OFF state. In this case, the processing for the off command signal can be reduced.

REFERENCE SIGNS LIST

MFC (Flow control device)
10A PIMFC
20, 20A Gas flow monitoring apparatus
21 Start shut-off valve
23 Pressure gauge
25, 25A Monitoring controller
25b Valve opening unit
25d Off-command signal input unit
25e Valve opening unit
26 Semiconductor manufacturing apparatus
130 Process gas supply source
140 Process chamber

What is claimed is:

1. A gas flow monitoring method for monitoring a flow rate of a flow control device,
the method using:
the flow control device for controlling a flow rate of process gas from a process gas supply source and supplying the process gas to a predetermined process chamber;
a start shut-off valve placed on an upstream side of the flow control device; and
a pressure gauge placed between the start shut-off valve and the flow control device, and
the method comprising:
closing the start shut-off valve and measuring a decrease in pressure on the upstream side of the flow control device to measure the flow rate of the flow control device; and
subsequently opening the start shut-off valve and monitoring the flow rate of the flow control device,
wherein the method further includes switching the flow control device from an ON state to an OFF state before opening the start shut-off valve.

2. The gas flow monitoring method according to claim 1, wherein
the method includes: a monitoring controller electrically connected to the start shut-off valve and the pressure gauge; and a semiconductor manufacturing apparatus electrically connected to the monitoring controller and the flow control device,
the semiconductor manufacturing apparatus switches the flow control device from the ON state to the OFF state after the monitoring controller measures the flow rate of the flow control device, and subsequently the semiconductor manufacturing apparatus inputs a flow measurement end signal instructing termination of flow measurement of the flow control device to the monitoring controller, and
the monitoring controller opens the start shut-off valve upon receipt of the flow measurement end signal.

3. The gas flow monitoring method according to claim 1, wherein
the method includes a monitoring controller electrically connected to a semiconductor manufacturing apparatus, the start shut-off valve, the pressure gauge, and the flow control device,
when the monitoring controller receives an off command signal to switch the flow control device from the ON state to the OFF state and a flow measurement start signal to start flow measurement of the flow control device from the semiconductor manufacturing apparatus, the monitoring controller closes the start shut-off valve and then measures the flow rate of the flow control device, and subsequently switches the flow control device from the ON state to the OFF state and opens the start shut-off valve.

4. A gas flow monitoring apparatus comprising:
a start shut-off valve placed in a gas line for supplying process gas from a process gas supply source to a predetermined process chamber via a flow control device, the start shut-off valve being located on an upstream side of the flow control device;
a pressure gauge placed between the start shut-off valve and the flow control device; and
a monitoring controller configured to close the start shut-off valve and measure a decrease in pressure on the upstream side of the flow control device in order to measure a flow rate of the flow control device,
wherein the monitoring controller is electrically connected to a semiconductor manufacturing apparatus configured to enable a process to be executed when the flow control device is in an ON state,
the semiconductor manufacturing apparatus is configured to switch the flow control device from the ON state to the OFF state and then transmit a flow measurement end signal instructing termination of flow measurement of the flow control device to the monitoring controller to the monitoring controller, and
the monitoring controller includes a valve opening unit configured to open the start shut-off valve when the monitoring controller receives the flow measurement end signal from the semiconductor manufacturing apparatus.

5. A gas flow monitoring apparatus comprising:
a start shut-off valve placed in a gas line for supplying process gas from a process gas supply source to a predetermined process chamber via a flow control device, the start shut-off valve being located on an upstream side of the flow control device;
a pressure gauge placed between the start shut-off valve and the flow control device; and
a monitoring controller configured to close the start shut-off valve and measure a decrease in pressure on the upstream side of the flow control device in order to measure a flow rate of the flow control device,
wherein the monitoring controller includes:
an off command signal input unit configured to receive an off command signal indicating a command to switch the flow control device to the OFF state, from a semiconductor manufacturing apparatus configured to enable a process to be executed when the flow control device is in an ON state, and
a valve opening unit configured to open the start shut-off valve after the off command signal input unit receives the off command signal from the semiconductor manufacturing apparatus and the flow rate of the flow control device is measured.

* * * * *